(12) United States Patent
Komaki

(10) Patent No.: US 12,176,699 B2
(45) Date of Patent: Dec. 24, 2024

(54) ELECTRICAL JUNCTION BOX

(71) Applicant: Sumitomo Wiring Systems, Ltd., Yokkaichi (JP)

(72) Inventor: Kazuya Komaki, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 18/044,874

(22) PCT Filed: Jul. 29, 2021

(86) PCT No.: PCT/JP2021/028058
§ 371 (c)(1),
(2) Date: Mar. 10, 2023

(87) PCT Pub. No.: WO2022/054445
PCT Pub. Date: Mar. 17, 2022

(65) Prior Publication Data
US 2023/0275415 A1 Aug. 31, 2023

(30) Foreign Application Priority Data

Sep. 14, 2020 (JP) .................................. 2020-153778

(51) Int. Cl.
*B60R 16/023* (2006.01)
*H02G 3/16* (2006.01)
*H02G 5/06* (2006.01)

(52) U.S. Cl.
CPC ......... *H02G 5/066* (2013.01); *B60R 16/0238* (2013.01); *H02G 3/16* (2013.01)

(58) Field of Classification Search
CPC .............................................. B60R 16/0239
See application file for complete search history.

(56) References Cited

U.S. PATENT DOCUMENTS

| 2015/0129299 A1* | 5/2015 | Ikeda ................... B60R 16/0238 174/535 |
| 2018/0331525 A1* | 11/2018 | Fukuhara ............. G01R 15/207 |
| 2019/0075678 A1* | 3/2019 | Aragones Carrete ........................ B60R 16/0238 |

FOREIGN PATENT DOCUMENTS

| JP | H6-217437 A | 8/1994 |
| JP | 2002-084625 A | 3/2002 |
| JP | 2007-089369 A | 4/2007 |

OTHER PUBLICATIONS

International Search Report, Application No. PCT/JP2021/028058, mailed Aug. 24, 2021. ISA/Japan Patent Office.

* cited by examiner

*Primary Examiner* — Hung V Ngo
(74) *Attorney, Agent, or Firm* — Honigman LLP

(57) ABSTRACT

Provided is an electrical junction box that can be reduced in size by accommodating a high-voltage bus bar and a low-voltage bus bar in a space-efficient manner. The electrical junction box is an electrical junction box for a vehicle including a housing that accommodates a high-voltage bus bar for high voltages and a low-voltage bus bar for low voltages, in which the low-voltage bus bar is attached to a top plate of the housing, the high-voltage bus bar is attached to a bottom plate facing the top plate, and the high-voltage bus bar and the low-voltage bus bar are disposed overlapping each other with a clearance distance therebetween in an up-down direction.

2 Claims, 5 Drawing Sheets

ELECTRICAL JUNCTION BOX

CROSS-REFERENCE TO RELATED APPLICATIONS

This application is the U.S. national stage of PCT/JP2021/028058 filed on Jul. 29, 2021, which claims priority to Japanese Patent Application No. JP 2020-153778 filed on Sep. 14, 2020, the contents of which are incorporated herein.

TECHNICAL FIELD

The present disclosure relates to an electrical junction box for a vehicle including a housing that accommodates bus bars.

BACKGROUND

In recent years, accompanying an expansion of vehicle functions, there is an increasing need for electrical junction boxes in which both high-voltage bus bars for high voltages of more than 30 V and low-voltage bus bars for low voltages of 30 V or less are accommodated. If a high-voltage bus bar and a low-voltage bus bar are to be accommodated together, short circuiting or so-called leakage such as leakage of an electric current may occur, and thus appropriate insulation measures will be required.

JP H6-217437A discloses an electrical junction box in which bus bars overlap each other, and if the overlapping portion is wide, an insulating plate covering the entire lower bus bar is provided, and if the overlapping portion is narrow and small, the bus bars overlap each other vertically in multiple layers with a lid-shaped insulating member that locally covers the overlapping portion of the lower bus bar being provided, for example.

However, because insulation between the low-voltage bus bar and the high-voltage bus bar is achieved by using the insulating plate and the lid-shaped insulating member in the electrical junction box disclosed in JP H6-217437A, an issue arises that the configuration of the electrical junction box becomes complicated and the size of the electrical junction box is increased.

In view of this, this disclosure aims to provide an electrical junction box that can be reduced in size by accommodating a high-voltage bus bar and a low-voltage bus bar in a space-efficient manner while ensuring insulation.

SUMMARY

The electrical junction box according to an embodiment of the present disclosure is an electrical junction box for a vehicle including a housing that accommodates a high-voltage bus bar for a high voltage and a low-voltage bus bar for a low voltage, in which the low-voltage bus bar is attached to a top plate of the housing, the high-voltage bus bar is attached to a bottom plate facing the top plate, and the high-voltage bus bar and the low-voltage bus bar are disposed overlapping each other with a clearance distance therebetween in an up-down direction.

According to this disclosure, it is possible to reduce the size of an electrical junction box by accommodating a high-voltage bus bar and a low-voltage bus bar in a space-efficient manner while ensuring insulation.

DETAILED DESCRIPTION OF PREFERRED EMBODIMENTS

Figure 1:
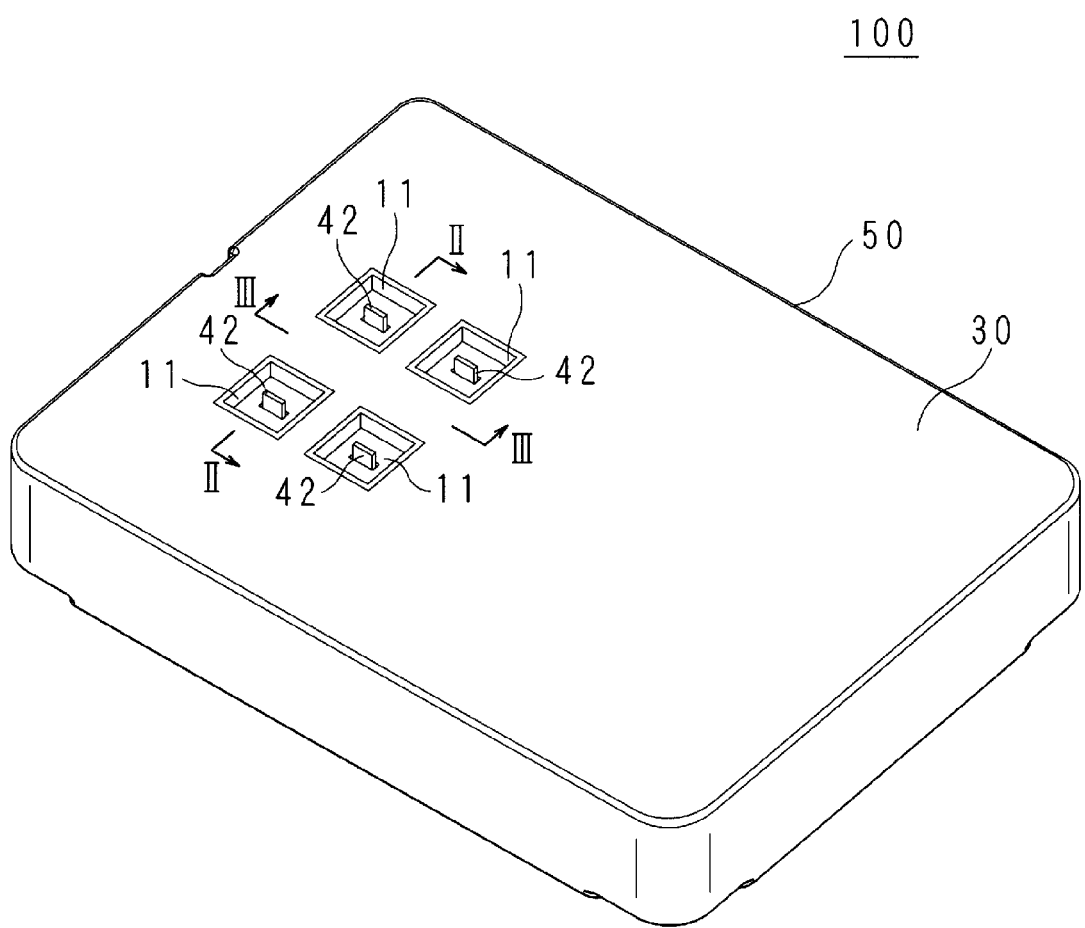
FIG. 1 is a perspective view of an electrical junction box according to Embodiment 1.

Firstly, embodiments of the present disclosure will be listed and described. Also, at least parts of the embodiments described below may also be freely combined.

First Aspect

In a first aspect, the electrical junction box according to an embodiment of the present disclosure is an electrical junction box for a vehicle including a housing that accommodates a high-voltage bus bar for a high voltage and a low-voltage bus bar for a low voltage, in which the low-voltage bus bar is attached to a top plate of the housing, the high-voltage bus bar is attached to a bottom plate facing the top plate, and the high-voltage bus bar and the low-voltage bus bar are disposed overlapping each other with a clearance distance therebetween in an up-down direction.

In this embodiment, because the low-voltage bus bar is attached to the top plate of the housing and the high-voltage bus bar is attached to the bottom plate, the high-voltage bus bar and the low-voltage bus bar are disposed overlapping each other with the clearance distance in the up-down direction. Therefore, the high-voltage bus bar and the low-voltage bus bar can be accommodated in the housing in a space-efficient manner while ensuring insulation.

Second Aspect

In a second aspect, the electrical junction box according to an embodiment of the present disclosure includes a distance maintaining portion that is provided in the housing and is configured to hold the high-voltage bus bar or the low-voltage bus bar and maintain the clearance distance.

In this embodiment, the distance maintaining portion holds the high-voltage bus bar or the low-voltage bus bar and maintains the clearance distance between the high-voltage bus bar and the low-voltage bus bar. Therefore, even when vibration is applied from the outside, for example, it is possible to reliably achieve insulation between the high-voltage bus bar and the low-voltage bus bar.

Third Aspect

In a third aspect, the electrical junction box according to an embodiment of the present disclosure, the low-voltage bus bar is disposed above the high-voltage bus bar.

In this embodiment, a low-voltage current flows through most of detachable external devices that are attached to the top plate of the housing, and the low-voltage bus bar is disposed above the high-voltage bus bar. Therefore, it is possible to easily realize a configuration in which two end portions of the low-voltage bus bar are exposed from the top plate to the outside in order to connect these external devices thereto, and reduce the size of the shape of the low-voltage bus bar.

Fourth Aspect

In a fourth aspect, the electrical junction box according to an embodiment of the present disclosure, the distance maintaining portion is provided on the top plate of the housing and holds the high-voltage bus bar.

In this embodiment, the distance maintaining portion is provided on the top plate, holds the high-voltage bus bar, and maintains the clearance distance between the high-voltage bus bar and the low-voltage bus bar. Therefore, even when vibration is applied from the outside, for example, it is possible to reliably achieve insulation between the high-voltage bus bar and the low-voltage bus bar.

DETAILS OF EMBODIMENTS OF THE PRESENT DISCLOSURE

An electrical junction box according to an embodiment of the present disclosure will be described below with reference to the drawings. Note that the present disclosure is not limited to these examples, and is defined by the claims, and all changes that come within the meaning and range of equivalency of the claims are intended to be embraced therein.

Embodiment 1

An electrical junction box for a vehicle according to an embodiment of the present disclosure will be described hereinafter based on the drawings.

FIG. 1 is a perspective view of an electrical junction box 100 according to Embodiment 1.

The electrical junction box 100 accommodates electric circuits that supply power from a power source to various loads of the vehicle. The electrical junction box 100 includes a substantially rectangular parallelepiped housing 50, and the housing 50 is made from an insulating material such as resin, for example.

The top plate 30 of the housing 50 is provided with four recessed engaging portions 11 for engaging with an external device such as an ECU. Each engaging portion 11 has a rectangular transverse cross-sectional shape, and is recessed in an outer face of the top plate 30. The engaging portions 11 are formed integrally with the housing 50 (the top plate 30).

Figure 2:
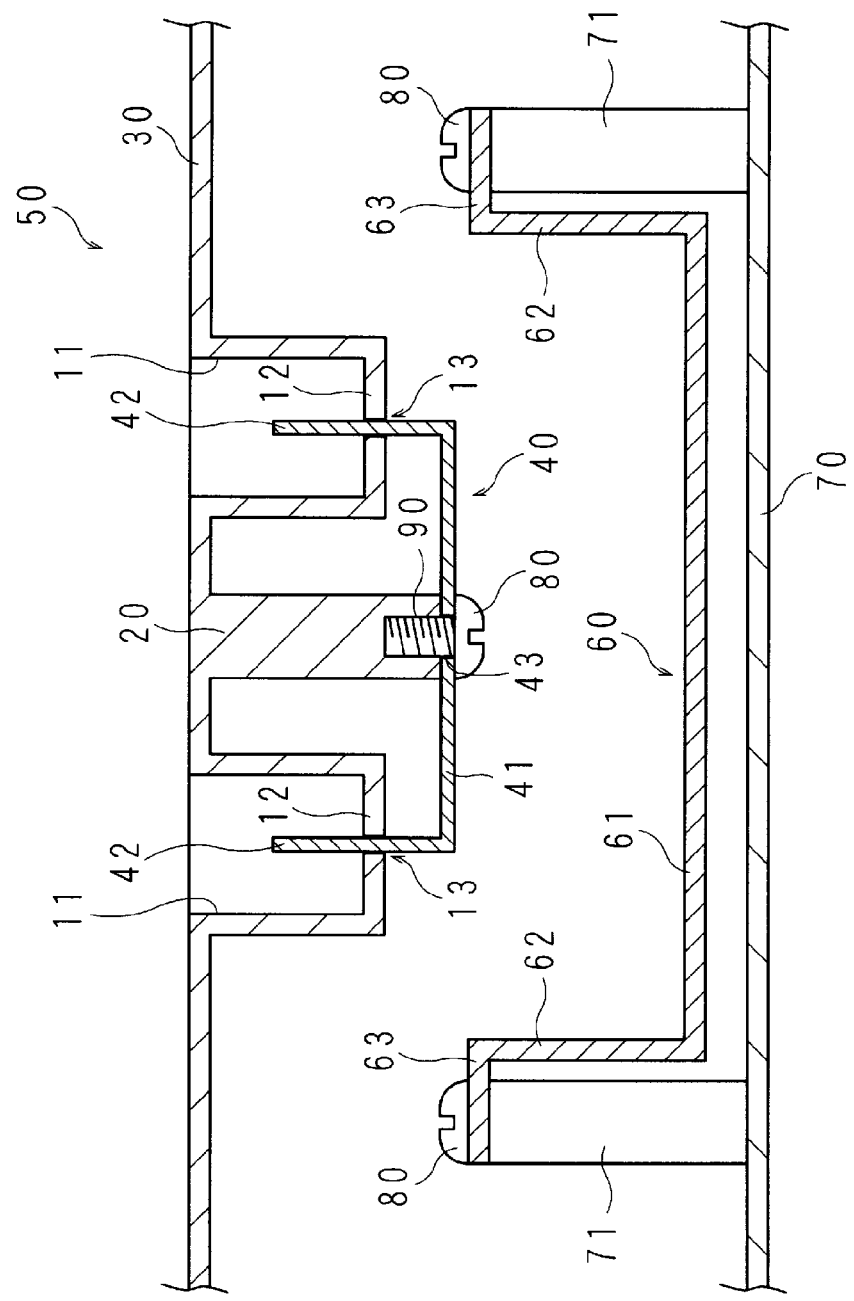
FIG. 2 is a schematic cross-sectional view taken along line II-II in FIG. 1.
Figure 3:
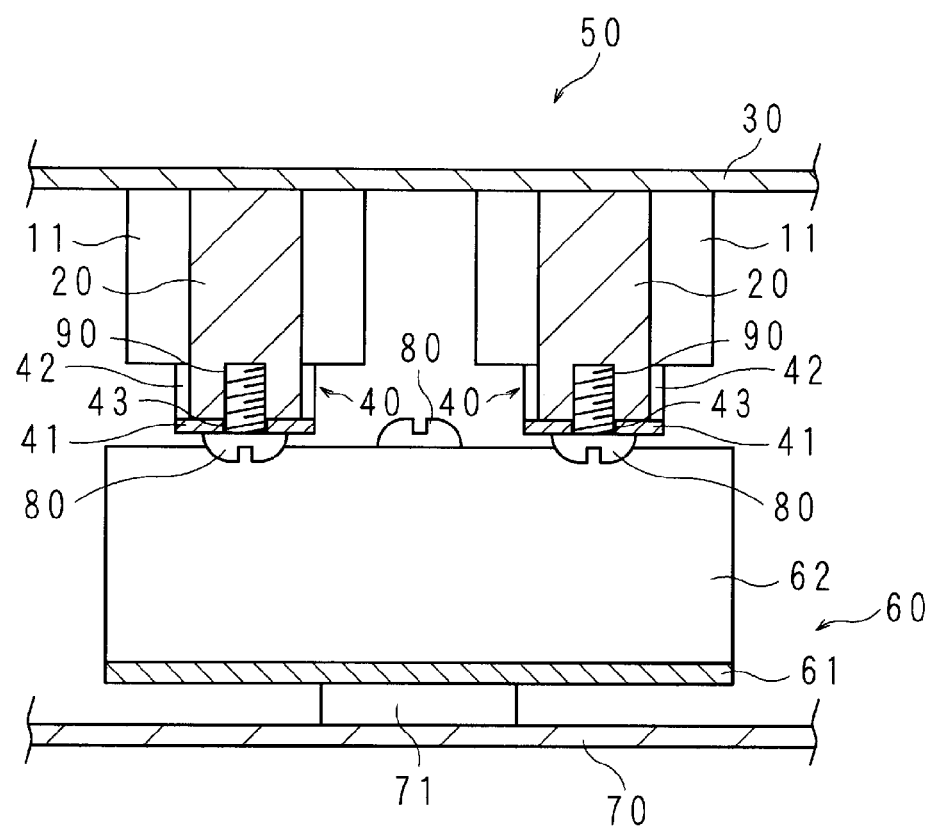
FIG. 3 is a schematic cross-sectional view taken along line III-III in FIG. 1.

FIG. 2 is a schematic cross-sectional view taken along line II-II in FIG. 1, and FIG. 3 is a schematic cross-sectional view taken along line III-III in FIG. 1.

The four engaging portions 11 are spaced apart from each other. More specifically, the four engaging portions 11 are formed in a rectangular shape when the centers of the engaging portions 11 are connected to each other. The four engaging portions 11 have the same shape, and thus only one engaging portion 11 will be described hereinafter.

A through hole 13 is formed in a bottom 12 of the engaging portion 11, and the through hole 13 has a shape conforming to a cross-sectional shape of an end portion 42 of a later-described low-voltage bus bar 40. The end portion 42 of the low-voltage bus bar 40 protrudes inward of the engaging portion 11 through the through hole 13.

The high-voltage bus bar 60 for high voltages of more than 30 V and the low-voltage bus bar 40 for low voltages of 30 V or less are accommodated in the housing 50. A current with a high voltage of 400 V to 500 V flows to a load such as an air conditioner via the high-voltage bus bar 60, and a current with a low voltage of 5 V to 12 V flows to loads such as a relay and ride via the low-voltage bus bar 40, for example. The low-voltage bus bar 40 and the high-voltage bus bar 60 are provided vertically with the clearance distance therebetween, and the low-voltage bus bar 40 is provided above the high-voltage bus bar 60. The electrical junction box 100 according to Embodiment 1 includes one high-voltage bus bar 60 and two low-voltage bus bars 40, for example.

Each low-voltage bus bar 40 is constituted by a rectangular conductive metal plate, and bent in a U-shape. That is, the low-voltage bus bar 40 includes a flat portion 41, and two end portions 42 that respectively extend vertically upward from the two ends of the flat portion 41. A through hole 43 is formed in a central portion of the flat portion 41.

On the other hand, a pedestal 20 for attaching the low-voltage bus bar 40 protrudes from an inner face of the top plate 30 between the engaging portions 11. The pedestal 20 has a quadrangular prism shape, and extends downward from the top plate 30. A screw hole 90 is formed in a lower end face of the pedestal 20.

A bolt 80 is inserted into the through hole 43 of the low-voltage bus bar 40, and screwed into the screw hole 90 of the pedestal 20. Accordingly, the low-voltage bus bar 40 is attached to the pedestal 20 such that the flat portion 41 is parallel to the top plate 30. In this case, the two end portions 42 of the low-voltage bus bar 40 are respectively inserted into the corresponding through holes 13 of the engaging portions 11 from inside the housing 50, and protrude inward of the engaging portion 11.

That is, as shown in FIG. 3, two end portions 42 of one of the two low-voltage bus bars 40 respectively protrude inward of the two corresponding engaging portions 11 through the through holes 13 of the engaging portions 11. Also, two end portions 42 of the other low-voltage bus bar 40 respectively protrude inward of the other two corresponding engaging portions 11 through the through holes 13 of the engaging portions 11. The two low-voltage bus bars 40 are arranged side-by-side with their main faces aligned with each other.

The high-voltage bus bar 60 is constituted by a rectangular conductive metal plate. The high-voltage bus bar 60 includes a flat central portion 61, two upright portions 62 that extend vertically from two ends of the central portion 61, and two flat end portions 63 that are respectively obtained by bending outward end portions of the upright portions 62 and extend parallel to the central portion 61. A through hole (not shown) is formed in a central portion of each flat end portion 63.

As shown in FIG. 2, two pedestals 71 for attaching the high-voltage bus bar 60 protrude from an inner face of a bottom plate 70 facing the top plate 30 below the engaging portions 11. Each pedestal 71 has a quadrangular prism shape, and extends upward from the bottom plate 70. A screw hole (not shown) is formed in an upper end face of the pedestal 71.

A bolt 80 is inserted into the through hole of the flat end portion 63 of the high-voltage bus bar 60 and screwed into the screw hole of the pedestal 71 that corresponds to this flat end portion 63. Accordingly, the high-voltage bus bar 60 is attached to the pedestals 71 such that the central portion 61 is parallel to the bottom plate 70.

In this case, the high-voltage bus bar 60 is disposed directly below the two low-voltage bus bars 40. That is, the high-voltage bus bar 60 is disposed overlapping the two low-voltage bus bars 40 in the up-down direction. Also, the high-voltage bus bar 60 and the low-voltage bus bars 40 are disposed with the clearance distance therebetween in the up-down direction.

As described above, because the low-voltage bus bars 40 are attached to the top plate 30, and the high-voltage bus bar 60 is attached to the bottom plate 70 in the electrical junction box 100 of Embodiment 1, the low-voltage bus bars 40 and the high-voltage bus bar 60 are accommodated in the housing 50 in the vertically overlapping state. Therefore, it is possible to accommodate the low-voltage bus bars 40 and the high-voltage bus bar 60 in the housing 50 in a space-efficient manner, and to reduce the size of the electrical junction box 100.

Also, because the high-voltage bus bar 60 and the low-voltage bus bars 40 are spaced apart from each other in the up-down direction at the clearance distance, it is possible to ensure the clearance distance as well as the creepage distance, and to reliably insulate the high-voltage bus bar 60 from the low-voltage bus bars 40.

In general vehicles, parts or devices that are replaceable during maintenance are disposed at positions where they can be seen from above, making replacement operations more convenient. Also, a low-voltage current flows through many of the replaceable parts or devices in terms of operation safety.

As described above, the engaging portions 11 are also formed on the top plate 30 of the housing 50 in the electrical junction box 100 of Embodiment 1, and engage with a replaceable external device. Also, the end portions 42 of the low-voltage bus bars 40 respectively protrude inward of the engaging portions 11 through the through holes 13 of the engaging portions 11.

Correspondingly, the low-voltage bus bars 40 are brought closer to the engaging portions 11 by disposing the low-voltage bus bars 40 above the high-voltage bus bar 60 in the electrical junction box 100 of Embodiment 1. This facilitates the work involved in assembling the electrical junction box 100 and reduces the size of the shape of the low-voltage bus bars 40.

Embodiment 2

Figure 4:
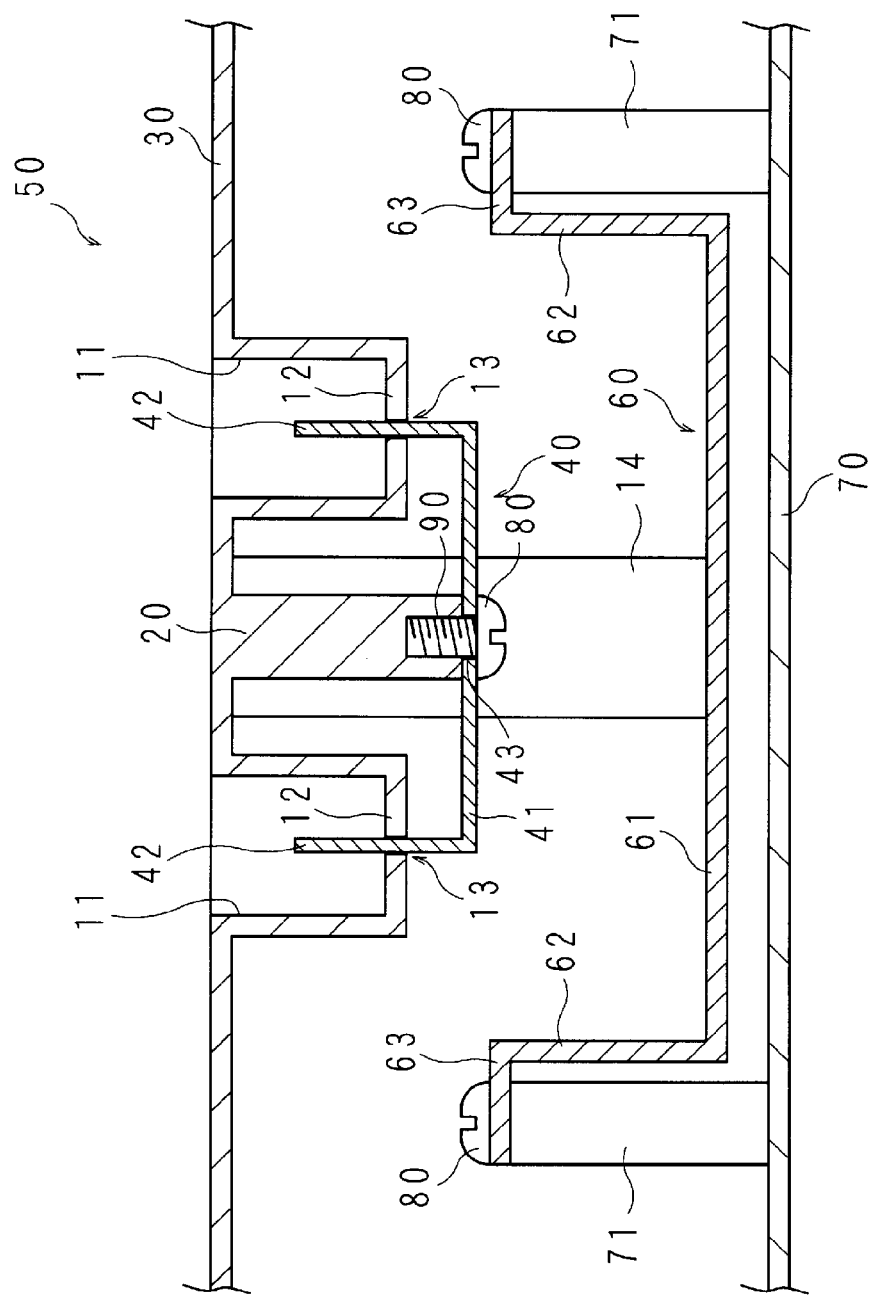
FIG. 4 is a schematic cross-sectional view illustrating an internal configuration of an electrical junction box according to Embodiment 2.
Figure 5:
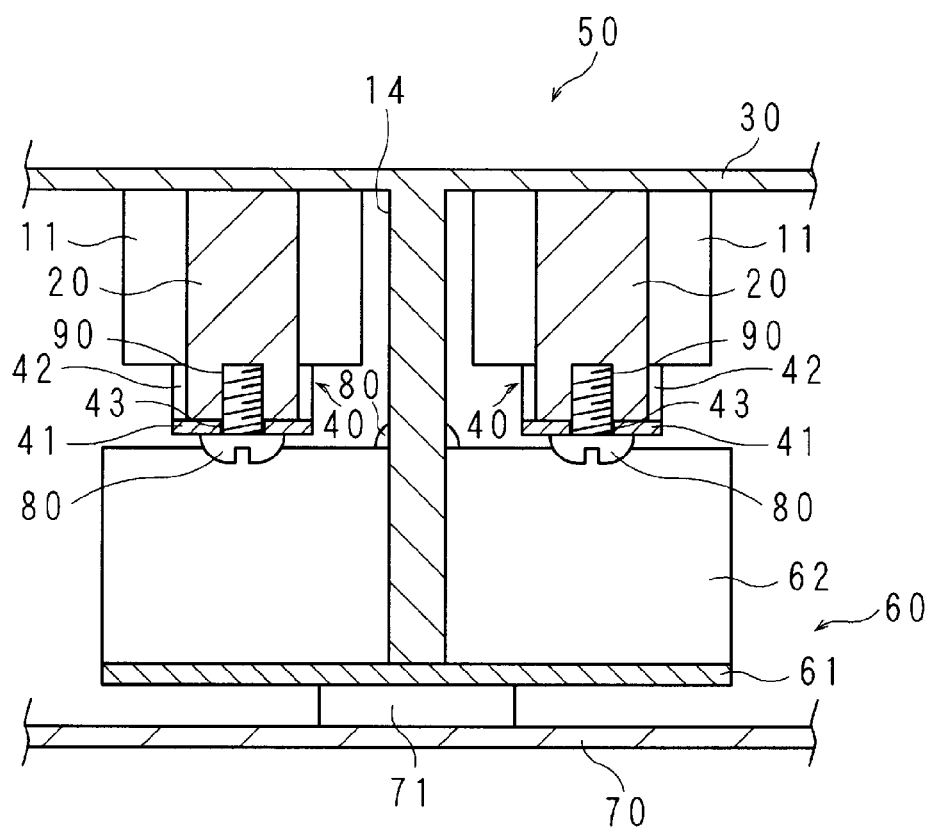
FIG. 5 is a schematic cross-sectional view illustrating an internal configuration of the electrical junction box according to Embodiment 2.

FIGS. 4 and 5 are schematic cross-sectional views illustrating an internal configuration of an electrical junction box 100 according to Embodiment 2. FIG. 4 corresponds to FIG. 2 showing Embodiment 1, and FIG. 5 corresponds to FIG. 3 showing Embodiment 1.

Similarly to Embodiment 1, the electrical junction box 100 of Embodiment 2 includes a housing 50, and four engaging portions 11 are formed in a top plate 30 of the housing 50. The four engaging portions 11 have the same shape, and thus only one engaging portion 11 will be described hereinafter.

Each engaging portion 11 has a recessed shape, which is a rectangular transverse cross-sectional shape, and is recessed in an outer face of the top plate 30. A though hole 13 is formed in a bottom 12 of the engaging portion 11, and an end portion 42 of a low-voltage bus bar 40 protrudes inward of the engaging portion 11 through the through hole 13.

The low-voltage bus bars 40 and a high-voltage bus bar 60 are accommodated in the housing 50. The low-voltage bus bars 40 and the high-voltage bus bar 60 are disposed vertically with the clearance distance therebetween, and the low-voltage bus bars 40 are provided above the high-voltage bus bar 60.

Each low-voltage bus bar 40 is constituted by a rectangular conductive metal plate, and includes a flat portion 41, and two end portions 42 that respectively extend vertically upward from two ends of the flat portion 41. A through hole 43 is formed in a central portion of the flat portion 41.

A pedestal 20 having a quadrangular prism shape protrudes from an inner face of the top plate 30 between the engaging portions 11, and a screw hole 90 is formed in a lower end face of the pedestal 20.

A bolt 80 is inserted into the through hole 43 of the low-voltage bus bar 40 and screwed into the screw hole 90 of the pedestal 20, and thereby the low-voltage bus bar 40 is attached to the pedestal 20. In this case, the flat portion 41 of the low-voltage bus bar 40 is parallel to the top plate 30.

As shown in FIG. 5, the two end portions 42 of one of the two low-voltage bus bars 40 respectively protrude inward of the two corresponding engaging portions 11 through the through holes 13 of the engaging portions 11. Also, the end portions 42 of the other low-voltage bus bar 40 respectively protrude inward of the other two corresponding engaging portions 11 through the through holes 13 of the engaging portions 11. The two low-voltage bus bars 40 are arranged side-by-side with their main faces aligned with each other.

The high-voltage bus bar 60 is constituted by a rectangular conductive metal plate. The high-voltage bus bar 60 includes a flat central portion 61, two upright portions 62 that extend vertically from two ends of the central portion 61, and two flat end portions 63 that are respectively obtained by bending outward end portions of the upright portions 62 and extend parallel to the central portion 61. A through hole (not shown) is formed in a central portion of each flat end portion 63.

As shown in FIG. 4, two pedestals 71 for attaching the high-voltage bus bar 60 protrude from an inner face of a bottom plate 70 below the engaging portions 11, and a screw hole (not shown) is formed in an upper end face of each pedestal 71.

A bolt 80 is inserted into the through hole of the flat end portion 63 of the high-voltage bus bar 60 and screwed into the screw hole of the pedestal 71 that corresponds to this flat end portion 63. Accordingly, the high-voltage bus bar 60 is attached to the pedestals 71 such that the central portion 61 is parallel to the bottom plate 70.

In this case, the high-voltage bus bar 60 and the low-voltage bus bars 40 are disposed with the clearance distance therebetween in the up-down direction. Also, the high-voltage bus bar 60 is disposed directly below the two engaging portions 11 and the two low-voltage bus bars 40 associated with the other two engaging portions 11, and the two low-voltage bus bars 40 and the high-voltage bus bar 60 overlap each other in the up-down direction.

Further, in the electrical junction box 100 of Embodiment 2, a distance maintaining portion 14 that maintains the distance between the high-voltage bus bar 60 and the low-voltage bus bars 40 protrudes from an inner face of the top plate 30 between the two engaging portions 11 and the other two engaging portions 11 (see FIG. 5). The distance maintaining portion 14 has a rectangular plate shape, passes between the two low-voltage bus bars 40, and extends to the high-voltage bus bar 60. A lower end of the distance maintaining portion 14 reaches the central portion 61 of the high-voltage bus bar 60, and holds the high-voltage bus bar 60.

As described above, the low-voltage bus bars 40 and the high-voltage bus bar 60 are accommodated in the housing 50 in the vertically overlapping state in the electrical junction box 100 of Embodiment 2. Therefore, it is possible to accommodate the low-voltage bus bars 40 and the high-voltage bus bar 60 in the housing 50 in a space-efficient manner, and to reduce the size of the housing 50.

Also, because the high-voltage bus bar 60 and the low-voltage bus bars 40 are disposed with the clearance distance therebetween in the up-down direction, it is possible to ensure the clearance distance as well as the creepage distance, and to reliably insulate the low-voltage bus bars 40 from the high-voltage bus bars 60.

Also, because the distance maintaining portion 14 supports and holds the high-voltage bus bar 60 from the top plate 30 side, even when the high-voltage bus bar 60 vibrates due to external vibrations, it is possible to prevent the high-voltage bus bar 60 from approaching the low-voltage bus bars 40, thus shortening the clearance distance.

Further, because the distance maintaining portion 14 is provided between two low-voltage bus bars 40, the size of the housing 50 can be reduced.

As for the high-voltage bus bar 60, the two flat end portions 63 are attached to the bottom plate 70 via the pedestal 71, the central portion 61 is supported by the distance maintaining portion 14 from the top plate 30 side, and the pedestal 71 and the distance maintaining portion 14 support the high-voltage bus bar 60 in the opposite directions. Therefore, even when the bolt 80 comes off from the screw hole of the pedestal 71 for some reasons, it is possible to inhibit the high-voltage bus bar 60 from approaching the low-voltage bus bars 40, thus shortening the clearance distance.

Although an example in which the distance maintaining portion 14 holds the high-voltage bus bar 60 was described above, the present disclosure is not limited to this. A configuration may be adopted in which the distance maintaining portion 14 holds the low-voltage bus bars 40, for example.

Portions that are similar to those of Embodiment 1 are given the same reference numerals, and detailed description thereof will be omitted.

Technical features (constituent elements) described in Embodiments 1 and 2 can be combined with each other, and new technical features can be obtained through combinations thereof.

The embodiments disclosed in this application are to be considered in all respects as illustrative and not restrictive. The scope of the present disclosure is indicated by the scope of the claims rather than by the meaning of the above description, and all changes that come within the meaning and range of equivalency of the claims are intended to be embraced therein.

The invention claimed is:

1. An electrical junction box for a vehicle, comprising:
    a housing that accommodates a high-voltage bus bar for a high voltage and a low-voltage bus bar for a low voltage;
    wherein the low-voltage bus bar is attached to a top plate of the housing;
    the high-voltage bus bar is attached to a bottom plate facing the top plate;
    the high-voltage bus bar and the low-voltage bus bar are disposed overlapping each other with a clearance distance therebetween in an up-down direction; and
    a distance maintaining portion disposed on at least one of the top plate and the bottom plate of the housing and is configured to hold a corresponding one of the high-voltage bus bar and the low-voltage bus bar so as to maintain the clearance distance.

2. The electrical junction box according to claim 1, wherein the low-voltage bus bar is disposed above the high-voltage bus bar.

\* \* \* \* \*